United States Patent
Huang et al.

(10) Patent No.: US 12,261,576 B2
(45) Date of Patent: Mar. 25, 2025

(54) RECEIVER CONTROL CIRCUIT AND TERMINAL

(71) Applicant: Honor Device Co., Ltd., Shenzhen (CN)

(72) Inventors: Ting Huang, Shenzhen (CN); Chen Zhu, Shenzhen (CN); Yingqun Feng, Shenzhen (CN); Yupeng Qiu, Shenzhen (CN)

(73) Assignee: Honor Device Co., Ltd., Shenzhen (CN)

( * ) Notice: Subject to any disclaimer, the term of this patent is extended or adjusted under 35 U.S.C. 154(b) by 355 days.

(21) Appl. No.: 17/779,360

(22) PCT Filed: Mar. 30, 2021

(86) PCT No.: PCT/CN2021/083930
§ 371 (c)(1),
(2) Date: May 24, 2022

(87) PCT Pub. No.: WO2021/218533
PCT Pub. Date: Nov. 4, 2021

(65) Prior Publication Data
US 2023/0045337 A1     Feb. 9, 2023

(30) Foreign Application Priority Data

Apr. 30, 2020     (CN) .......................... 202010367643.5

(51) Int. Cl.
H04B 1/16     (2006.01)
G01S 15/04     (2006.01)
(Continued)

(52) U.S. Cl.
CPC .............. H03F 3/193 (2013.01); G01S 15/04 (2013.01); H01L 29/783 (2013.01); H03F 1/301 (2013.01);
(Continued)

(58) Field of Classification Search
CPC ...... H03K 17/51; H03K 17/56; H03K 17/687; H03K 17/693; H03K 19/017509;
(Continued)

(56) References Cited

U.S. PATENT DOCUMENTS 8,558,288 B2 * 10/2013 Rothberg ............. G01N 27/414
                                                           330/109
8,633,370 B1     1/2014 Raley et al.
(Continued)

FOREIGN PATENT DOCUMENTS

CN     106550074 A     3/2017
CN     207022056 U     2/2018
(Continued)

*Primary Examiner* — Long Nguyen
(74) *Attorney, Agent, or Firm* — Leydig, Voit & Mayer, Ltd.

(57) ABSTRACT

Disclosed are a receiver control circuit and a terminal. The receiver control circuit includes: a smart power amplifier module, a coder-decoder, and a receiver. The smart power amplifier module is electrically connected to the receiver by a first switch module. The first switch module includes a first switch component unit that is formed by a metal oxide semiconductor field-effect transistor (MOSFET). The first switch module further includes a first follower unit, where the first follower unit is configured to keep an unchanged voltage difference between a gate electrode of the MOSFET of the first switch component unit and a drain electrode thereof, and a gate electrode voltage of the MOSFET of the first switch component unit is greater than a drain electrode voltage thereof. The coder-decoder is electrically connected to the receiver by the second switch module. The second switch module includes a second switch component unit.

8 Claims, 4 Drawing Sheets

(51) Int. Cl.
  *H01L 29/78*     (2006.01)
  *H03F 1/30*      (2006.01)
  *H03F 3/193*     (2006.01)
  *H03F 3/345*     (2006.01)
  *H03F 3/72*      (2006.01)
  *H03K 19/0175*   (2006.01)
  *H04R 5/04*      (2006.01)

(52) U.S. Cl.
  CPC ............... *H03F 3/345* (2013.01); *H03F 3/72* (2013.01); *H03K 19/017509* (2013.01); *H04B 1/16* (2013.01); *H04R 5/04* (2013.01); *H01L 2924/13091* (2013.01)

(58) Field of Classification Search
  CPC . H04B 1/06; H04B 1/16; H04B 1/163; H04B 1/18; H04R 5/04; H03F 1/301; H03F 3/193; H03F 3/20; H03F 3/345; H01L 29/783; H01L 2924/13091; G01S 15/04
  See application file for complete search history.

(56) References Cited

U.S. PATENT DOCUMENTS

| | | | |
|---|---|---|---|
| 8,742,849 | B1 | 6/2014 | Gupta et al. |
| 9,961,465 | B2 | 5/2018 | Lan et al. |
| 2010/0134147 | A1 | 6/2010 | Ohta et al. |
| 2020/0044614 | A1 | 2/2020 | Esmael |

FOREIGN PATENT DOCUMENTS

| | | |
|---|---|---|
| CN | 108322844 A | 7/2018 |
| CN | 110989860 A | 4/2020 |
| WO | 2016029448 A1 | 3/2016 |

\* cited by examiner

RECEIVER CONTROL CIRCUIT AND TERMINAL

CROSS-REFERENCE TO RELATED APPLICATIONS

This application is a National Stage of International Application No. PCT/CN2021/083930, filed on Mar. 30, 2021, which claims priority to Chinese Patent Application No. 202010367643.5, filed on Apr. 30, 2020, both of which are hereby incorporated by reference in their entireties.

TECHNICAL FIELD

This application relates to the field of electronic device technologies, and in particular, to a receiver control circuit and a terminal.

BACKGROUND

Terminals such as mobile phones are provided with a proximity sensor for detecting proximity of external objects. With the proximity sensor, the terminal is able to implement some functions, for example, preventing an unintended touch during a call, turning off the screen when detecting proximity of an external object to prevent an unintended touch, or preventing an unintended touch in a pocket based on the same principle. Some mobile phones use a receiver to emit ultrasonic waves and a microphone to receive ultrasonic waves, so as to implement functions of the proximity sensor. However, with increasingly higher requirements on sound quality of the terminal, stereo is increasingly applied to mobile phones. Stereo means simultaneously playing music through an upper receiver and a lower loudspeaker. This requires higher power, so it is generally driven by a high-efficiency smart power amplifier (Smart PA) module. However, due to reasons such as incompatibility between the smart PA module and frequency of ultrasonic waves, it is impossible to implement on a stereo-enabled terminal functions of a proximity sensor by using a receiver to emit ultrasonic waves.

SUMMARY

The technical solutions in this application provides a receiver control circuit and a terminal, which can implement on a stereo-enabled terminal functions of a proximity sensor by using a receiver to emitting ultrasonic waves.

According to a first aspect, the technical solutions of this application provide a receiver control circuit, including: a smart power amplifier module, a coder-decoder, a receiver, a first switch module, and a second switch module. The smart power amplifier module is electrically connected to the receiver by the first switch module. The first switch module includes a first switch component unit, where the first switch component unit is connected between the smart power amplifier module and the receiver, the first switch component unit is configured to control continuity and cutoff between the smart power amplifier module and the receiver, and the first switch component unit is formed by a metal oxide semiconductor field-effect transistor (MOSFET). The MOSFET of the first switch component unit is of N-type, a drain electrode of the MOSFET of the first switch component unit is electrically connected to the smart power amplifier module, and a source electrode of the MOSFET of the first switch component unit is electrically connected to the receiver. The first switch module further includes a first follower unit, where the first follower unit is configured to keep an unchanged voltage difference between a gate electrode of the MOSFET of the first switch component unit and the drain electrode thereof, and a gate electrode voltage of the MOSFET of the first switch component unit is greater than a drain electrode voltage thereof. The coder-decoder is electrically connected to the receiver by the second switch module. The second switch module includes a second switch component unit, where the second switch component unit is connected between the coder-decoder and the receiver, the second switch component unit is configured to control continuity and cutoff between the coder-decoder and the receiver, and the second switch component unit is formed by a metal oxide semiconductor field-effect transistor MOSFET.

Optionally, the MOSFET of the second switch component unit is of N-type, a source electrode of the MOSFET of the second switch component unit is electrically connected to the coder-decoder, and a drain electrode of the MOSFET of the second switch component unit is electrically connected to the receiver. The second switch module further includes a second follower unit, where the second follower unit is configured to keep an unchanged voltage difference between a gate electrode of the MOSFET of the second switch component unit and the source electrode thereof.

Optionally, the smart power amplifier module includes a first output terminal and a second output terminal, and the receiver includes a first input terminal and a second input terminal; the first switch component unit includes a first transistor and a second transistor, where the first transistor and the second transistor are N-type MOSFETs, a source electrode of the first transistor is electrically connected to the first input terminal of the receiver, a drain electrode of the first transistor is electrically connected to the first output terminal of the smart power amplifier module, a source electrode of the second transistor is electrically connected to the second input terminal of the receiver, and a drain electrode of the second transistor is electrically connected to the second output terminal of the smart power amplifier module; and the first follower unit includes a first capacitor, where the first capacitor is connected in series between a gate electrode of the first transistor and the drain electrode thereof; a second capacitor, where the second capacitor is connected in series between a gate electrode of the second transistor and the drain electrode thereof; a first resistor, where the first resistor is connected in series between the gate electrode of the first transistor and a direct current (DC) bias control point; and a second resistor, where the second resistor is connected in series between the gate electrode of the second transistor and the DC bias control point.

Optionally, the receiver control circuit further includes a third resistor, where the third resistor is connected in series between the DC bias control point and a DC bias voltage terminal; and a third transistor, where the third transistor is connected in series between the DC bias control point and a ground terminal.

Optionally, the coder-decoder includes a first output terminal and a second output terminal, and the receiver includes a first input terminal and a second input terminal. The second switch component unit includes a fourth transistor and a fifth transistor, where the fourth transistor and the fifth transistor are N-type MOSFETs, a source electrode of the fourth transistor is electrically connected to the first output terminal of the coder-decoder, a drain electrode of the fourth transistor is electrically connected to the first input terminal of the receiver, a source electrode of the fifth transistor is electrically connected to the second output terminal of the coder-decoder, and a drain electrode of the fifth transistor is electrically connected to the second input terminal of the receiver. The second follower unit includes a third capacitor, where the third capacitor is connected in series between the source electrode of the fourth transistor and a gate electrode thereof; a fourth resistor, where the fourth resistor is connected in series between the gate electrode of the fourth transistor and a first DC bias control terminal; a fourth capacitor, where the fourth capacitor is connected in series between the source electrode of the fifth transistor and a gate electrode thereof; and a fifth resistor, where the fifth resistor is connected in series between the gate electrode of the fifth transistor and a second DC bias control terminal.

Optionally, the receiver control circuit further includes a sixth resistor and a seventh resistor, where the sixth resistor is connected in series between the source electrode of the fourth transistor and a ground terminal, and the seventh resistor is connected in series between the source electrode of the fifth transistor and the ground terminal.

Optionally, the receiver control circuit further includes a fifth capacitor, where the fifth capacitor is connected in series between the gate electrode of the first transistor and the first input terminal of the receiver; and a sixth capacitor, where the sixth capacitor is connected in series between the gate electrode of the second transistor and the second input terminal of the receiver.

According to a second aspect, the technical solutions of this application further provide a terminal, including the foregoing receiver control circuit.

In the receiver control circuit and terminal in the embodiments of this application, when stereo play is required, the second switch component unit, formed by the MOSFET, controls cutoff between the coder-decoder and the receiver, the first switch component unit, formed by the MOSFET, controls continuity between the smart power amplifier module and the receiver, and the first follower unit ensures normal transmission of PWM signals, so that the smart power amplifier can drive the receiver to implement a stereo function. In this case, even if a high voltage occurs in the smart power amplifier module, a cutoff function of the second switch component unit can reduce an adverse impact of the high voltage of the smart power amplifier module on the coder-decoder. When functions of a proximity sensor are implemented through the receiver, even if a negative voltage occurs in the coder-decoder, because the first switch component unit controls cutoff between the smart power amplifier module and the receiver, an adverse impact of the negative voltage of the coder-decoder on the smart power amplifier module is reduced. Controlling continuity between the coder-decoder and the receiver by using the second switch component unit, to be specific, driving the receiver by the coder-decoder, allows the receiver to emit ultrasonic waves, to judge proximity of an external object, thereby implementing the functions of the proximity sensor. In other words, the receiver control circuit in the embodiments of this application can implement on a stereo-enabled terminal functions of a proximity sensor by using a receiver to emit ultrasonic waves.

DESCRIPTION OF EMBODIMENTS

Terms used in the embodiments of this application are merely intended to describe specific embodiments but not to limit this application.

Before the embodiments of this application are introduced, the problems in the prior art and the process of the embodiments of this application presented by the inventor are first described. When functions of a proximity sensor are implemented by using a receiver to emit ultrasonic waves, the receiver is driven by a coder-decoder (CODEC), but a stereo function cannot be implemented in such a drive manner. To implement the stereo function, a smart PA module is required to drive the receiver. Currently, an algorithm for the smart PA module uses a signal with a sample rate of 48 KHz and a corresponding audio frequency range of 20 Hz to 20 KHz. However, ultrasonic waves have an audio frequency range of 20 kHz to 40 kHz, to be specific, the smart PA module needs to use more than twice the sample rate, for example, a sample rate of 96 KHz. This consumes high power and requires more memory. Moreover, if an algorithm for the ultrasonic waves is designed into the smart PA module with a stereo function, it requires planning hashrate for the algorithm for ultrasonic waves in advance while ensuring stereo sound quality, which involves high improvement costs. Considering the foregoing reasons, to allow the terminal to implement stereo and emit ultrasonic waves through the receiver, the inventor provides the following ideas: Idea 1: A switch is directly used to switch the smart PA module and the CODEC. However, a voltage of the smart PA module is up to 10 V, a voltage of the CODEC is negative, and currently, there is no such a high pressure resistant switch that may establish continuity of a negative voltage. Idea 2: A capacitor is connected in series or an amplifier circuit is disposed between the CODEC and the receiver, so that a voltage transmitted by the CODEC to the receiver is raised to a positive voltage, but the capacitor and the amplifier in this solution may cause a drop of a low frequency audio indicator.

Figure 1:
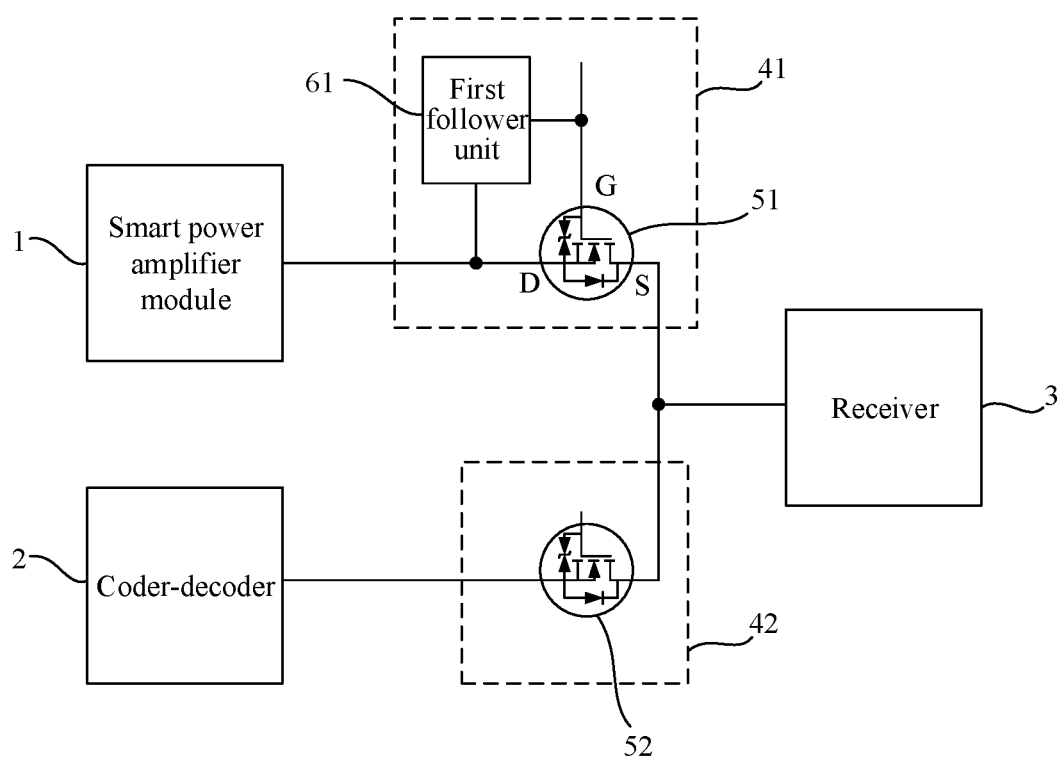
FIG. 1 is a schematic structural diagram of a receiver control circuit according to an embodiment of this application.

The following describes the technical solutions in the embodiments of this application, as shown in FIG. 1, FIG. 1 is a schematic structural diagram of a receiver control circuit according to an embodiment of this application. This embodiment of this application provides a receiver control circuit, including: a smart power amplifier module 1, a coder-decoder 2, a receiver 3, a first switch module 41, and a second switch module 42. The smart power amplifier module 1 is electrically connected to the receiver 3 by the first switch module 41. The first switch module 41 includes a first switch component unit 51, where the first switch component unit 51 is connected between the smart power amplifier module 1 and the receiver 3, the first switch component unit 51 is configured to control continuity and cutoff between the smart power amplifier module 1 and the receiver 3, and the first switch component unit 51 is formed by a metal oxide semiconductor field-effect transistor MOSFET. The MOSFET of the first switch component unit 51 is of N-type, a drain electrode D of the MOSFET of the first switch component unit 51 is electrically connected to the smart power amplifier module 1, a source electrode S of the MOSFET of the first switch component unit 51 is electrically connected to the receiver 3, and a gate electrode G of the MOSFET of the first switch component unit 51 is configured to control continuity and cutoff of the MOSFET. The first switch module 41 further includes a first follower unit 61, where the first follower unit 61 is configured to keep an unchanged voltage difference between a gate electrode G of the MOSFET of the first switch component unit 51 and a drain electrode D thereof, and a voltage of the gate electrode G of the MOSFET of the first switch component unit 51 is greater than a voltage of the drain electrode D thereof. The coder-decoder 2 is electrically connected to the receiver 3 by the second switch module 42. The second switch module 42 includes a second switch component unit 52, where the second switch component unit 52 is connected between the coder-decoder 2 and the receiver 3, the second switch component unit 52 is configured to control continuity and cutoff between the coder-decoder 2 and the receiver 3, and the second switch component unit 52 is formed by a metal oxide semiconductor field-effect transistor MOSFET.

Specifically, the first switch component unit 51 is formed by a MOSFET, and may establish continuity of a high voltage of the smart power amplifier module 1. Moreover, an output signal from the smart power amplifier module 1 is a pulse width modulation (PWM) signal, for example, a high voltage of the pulse is 10 V, and a low voltage of the pulse is (V. To ensure they both may be transmitted by the MOSFET, an N-type MOSFET is used. In addition, when the first switch component unit 51 controls continuity between the smart power amplifier module 1 and the receiver 3, the voltage of the gate electrode G of the MOSFET of the first switch component unit 51 is controlled to be greater than the voltage of the drain electrode D thereof by using the first follower unit 61, so as to ensure normal continuity of the MOSFET in transmissions of 10 V and 0 V. Working process of the foregoing receiver control circuit is as following: When stereo play is required, the second switch component unit 52 controls cutoff between the coder-decoder 2 and the receiver 3, the first switch component unit 51 controls continuity between the smart power amplifier module 1 and the receiver 3, to be specific, the smart power amplifier module 1 drives the receiver 3 to implement a stereo function. In this case, even if a negative voltage occurs in the coder-decoder 2, because of a cutoff function of the second switch component unit 52, the negative voltage does not affect the receiver 3. When functions of a proximity sensor are implemented through the receiver 3, the first switch component unit 51 controls cutoff between the smart power amplifier module 1 and the receiver 3. In this case, even if a high voltage occurs in the smart power amplifier module 1, the high voltage does not affect the receiver 3. Controlling continuity between the coder-decoder 2 and the receiver 3 by using the second switch component unit 52, to be specific, driving the receiver 3 by the coder-decoder 2, allows the receiver 3 to emit ultrasonic waves to judge proximity of an external object, thereby implementing the functions of the proximity sensor.

In the receiver control circuit in the embodiments of this application, when stereo play is required, the second switch component unit formed by the MOSFET controls cutoff between the coder-decoder and the receiver, the first switch component unit formed by the MOSFET controls continuity between the smart power amplifier module and the receiver, and the first follower unit ensures normal transmission of a PWM signal, so that the smart power amplifier module can drive the receiver to implement a stereo function. In this case, even if a high voltage occurs in the smart power amplifier module, a cutoff function of the second switch component unit can reduce an adverse impact of the high voltage of the smart power amplifier module on the coder-decoder. When functions of a proximity sensor are implemented through the receiver, even if a negative voltage occurs in the coder-decoder, because the first switch component unit controls cutoff between the smart power amplifier module and the receiver, an adverse impact of the negative voltage of the coder-decoder on the smart power amplifier module is reduced. Controlling continuity between the coder-decoder and the receiver by using the second switch component unit, to be specific, driving the receiver by the coder-decoder, allows the receiver to emit ultrasonic waves, to judge proximity of an external object, thereby implementing the functions of the proximity sensor. In other words, the receiver control circuit in the embodiments of this application may implement on a stereo-enabled terminal functions of a proximity sensor by using a receiver to emit ultrasonic waves.

Figure 2:
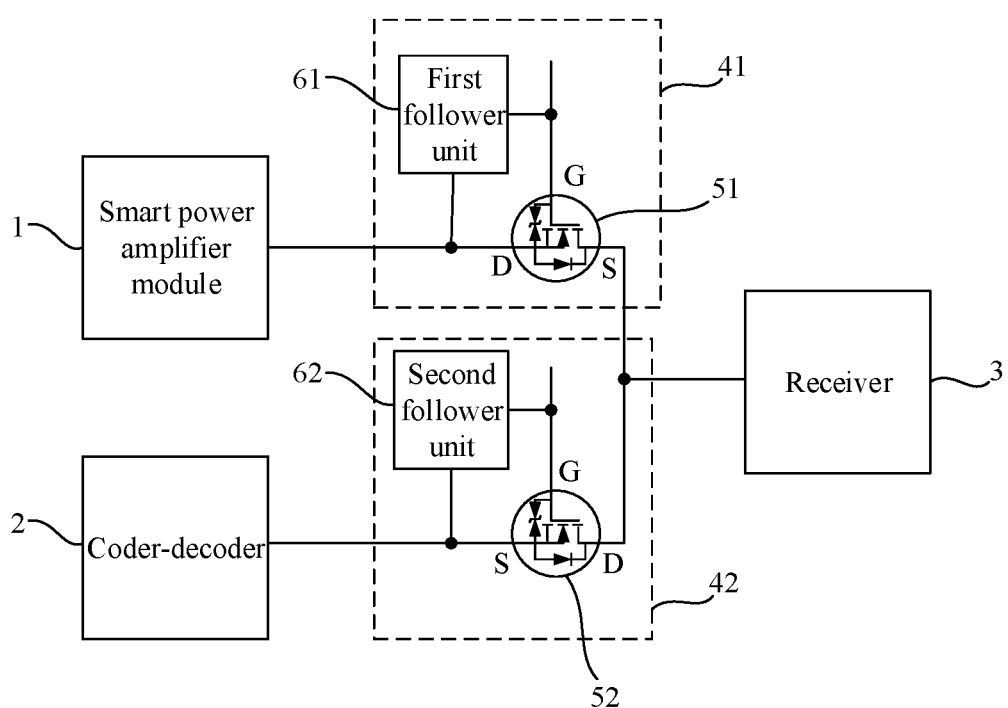
FIG. 2 is a schematic structural diagram of another receiver control circuit according to an embodiment of this application.

Optionally, as shown in FIG. 2, FIG. 2 is a schematic structural diagram of another receiver control circuit according to an embodiment of this application. The MOSFET of the second switch component unit 52 is of N-type, a source electrode S of the MOSFET of the second switch component unit 52 is electrically connected to the coder-decoder 2, and a drain electrode D of the MOSFET of the second switch component unit 52 is electrically connected to the receiver 3; and the second switch module 42 further includes a second follower unit 62, where the second follower unit 62 is configured to keep an unchanged voltage difference between a gate electrode G of the MOSFET of the second switch component unit 52 and the source electrode S thereof.

Specifically, an output signal of the coder-decoder 2 is an analog signal. Fluctuation in the analog signal greatly affects the sound quality. Therefore, the second follower unit 62 is disposed to keep an unchanged voltage difference between a gate electrode G of the MOSFET of the second switch component unit 52 and the source electrode S thereof when continuity of the MOSFET of the second switch component unit 52 is established, so as to ensure unchanged continuity impedance of the MOSFET, thereby reducing fluctuation in the analog output signal of the coder-decoder 2.

Figure 3:
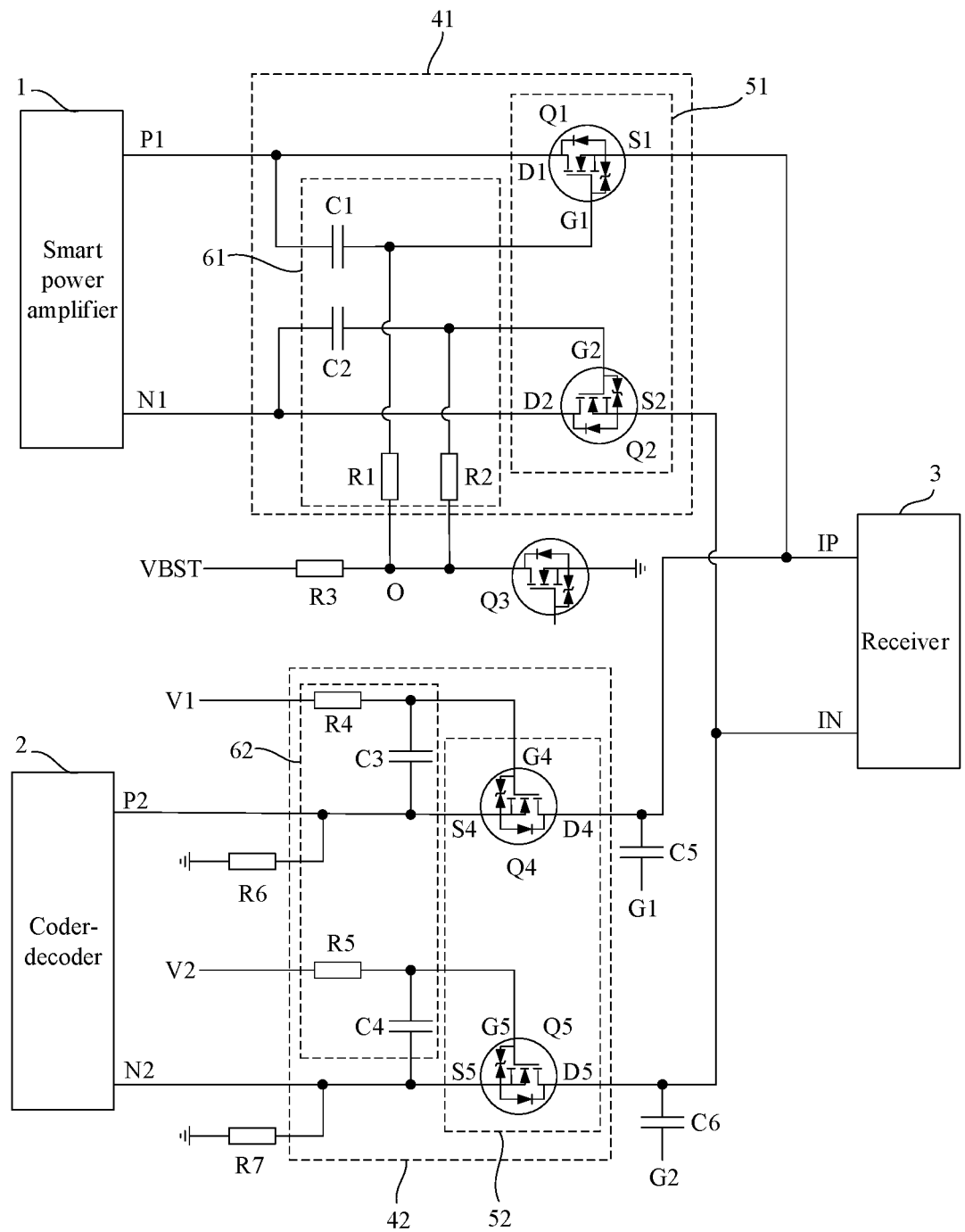
FIG. 3 is a schematic structural diagram of another receiver control circuit according to an embodiment of this application.

Optionally, as shown in FIG. 3, FIG. 3 is a schematic structural diagram of another receiver control circuit according to an embodiment of this application. A smart power amplifier module 1 includes a first output terminal P1 and a second output terminal N1, and a receiver 3 includes a first input terminal IP and a second input terminal IN: a first switch component unit 51 includes a first transistor Q1 and a second transistor Q2, where the first transistor Q1 and the second transistor Q2 are N-type MOSFETs, a source electrode SI of the first transistor Q1 is electrically connected to the first input terminal IP of the receiver 3, a drain electrode D1 of the first transistor Q1 is electrically connected to the first output terminal P1 of the smart power amplifier module 1, a source electrode SI of the second transistor Q2 is electrically connected to the second input terminal IN of the receiver 3, and a drain electrode D2 of the second transistor Q2 is electrically connected to the second output terminal N1 of the smart power amplifier module 1; and a first follower unit 61 includes a first capacitor C1, where the first capacitor C1 is connected in series between a gate electrode G1 of the first transistor Q1 and the drain electrode D1 thereof: a second capacitor C2, where the second capacitor C2 is connected in series between a gate electrode G2 of the second transistor Q2 and the drain electrode D2 thereof: a first resistor R1, where the first resistor R1 is connected in series between the gate electrode G1 of the first transistor Q1 and a DC bias control point O; and a second resistor R2, where the second resistor R2 is connected in series between the gate electrode G2 of the second transistor Q2 and the DC bias control point O.

Specifically, the first output terminal P1 corresponds to the first input terminal IP, and the second output terminal N1 corresponds to the second input terminal IN, so that the receiver 3 is controlled by using a differential signal. When the first switch component unit 51 controls continuity between the smart power amplifier module 1 and the receiver 3, the DC bias control point O provides a DC bias voltage. By using the first follower unit 61, a voltage of the gate electrode G1 of the first transistor Q1 is controlled to be greater than a voltage of the drain electrode D1 thereof, and a voltage of the gate electrode G2 of the second transistor Q2 is controlled to be greater than a voltage of the drain electrode D2 thereof. For example, for an output waveform of the first output terminal P1, a high voltage is 10 V, and a low voltage is 0 V. To ensure that voltages between 0 V and 10 V may be transmitted to the receiver 3, the first follower unit 61 is configured to ensure that the voltage of the gate electrode G1 of the first transistor Q1 is 5 V greater than the voltage of the drain electrode D1 thereof, that is, ensure that a voltage difference between the gate electrode G1 of the first transistor Q1 and the source electrode SI thereof is greater than a threshold voltage, so as to establish continuity.

Optionally, as shown in FIG. 3, the receiver control circuit further includes a third resistor R3, where the third resistor R3 is connected in series between the DC bias control point O and a DC bias voltage terminal VBST; and a third transistor Q3, where the third transistor Q3 is connected in series between the DC bias control point O and a ground terminal.

Specifically, a drain electrode of the third transistor Q3 is electrically connected to the DC bias control point O, a source electrode of the third transistor Q3 is grounded, and a gate electrode of the third transistor Q3 is electrically connected to a control signal. When the third transistor Q3 is cut off, the DC bias voltage provided by the DC bias voltage terminal VBST, the third resistor R3, and the first follower unit 61 may jointly control continuity between the first transistor Q1 and the second transistor Q2. To be specific, continuity between the smart power amplifier module 1 and the receiver 3 is controlled, and the receiver 3 is driven by the smart power amplifier module 1. When cutoff between the smart power amplifier module 1 and the receiver 3 is required to be controlled, continuity of the third transistor Q3 may be controlled by using the control signal. Even if a voltage of DC bias control point O is pulled down, the cutoff between the first transistor Q1 and the second transistor Q2 may be controlled.

Optionally, as shown in FIG. 3, the coder-decoder 2 includes a first output terminal P2 and a second output terminal N2, and the receiver 3 includes a first input terminal IP and a second input terminal IN: the second switch component unit 52 includes a fourth transistor Q4 and a fifth transistor Q5, where the fourth transistor Q4 and the fifth transistor Q5 are N-type MOSFETs, a source electrode S4 of the fourth transistor Q4 is electrically connected to the first output terminal P2 of the coder-decoder 2, a drain electrode D4 of the fourth transistor Q4 is electrically connected to the first input terminal IP of the receiver 3, a source electrode S5 of the fifth transistor Q5 is electrically connected to the second output terminal N2 of the coder-decoder 2, and a drain electrode D5 of the fifth transistor Q5 is electrically connected to the second input terminal IN of the receiver 3; and the second follower unit 62 includes a third capacitor C3, where the third capacitor C3 is connected in series between the source electrode S4 of the fourth transistor Q4 and a gate electrode G4 thereof: a fourth resistor R4, where the fourth resistor R4 is connected in series between the gate electrode G4 of the fourth transistor Q4 and a first DC bias control terminal V1; a fourth capacitor C4, where the fourth capacitor C4 is connected in series between the source electrode S5 of the fifth transistor Q5 and a gate electrode G5 thereof; and a fifth resistor R5, where the fifth resistor R5 is connected in series between the gate electrode G5 of the fifth transistor Q5 and a second DC bias control terminal V2.

Specifically, the first DC bias control terminal V1 and the second DC bias control terminal V2.may be one voltage terminal to provide a same signal, or may be different voltage terminals. A voltage signal provided by the first DC bias control terminal V1 may control continuity or cutoff of the fourth transistor Q4. Similarly, a voltage signal provided by the second DC bias control terminal V2 may control continuity or cutoff of the fifth transistor Q5. In the case of controlling continuity of the fourth transistor Q4 and the fifth transistor Q5, the first DC bias control terminal V1 and the second DC bias control terminal V2 provide DC bias voltages, and are used together with the second follower unit 62 to keep an unchanged voltage difference between the gate electrode G4 of the fourth transistor Q4 and the source electrode S4 thereof, that is, keep unchanged continuity impedance, and keep an unchanged voltage difference between the gate electrode G5 of the fifth transistor Q5 and the source electrode S5 thereof, that is, keep unchanged continuity impedance, when an output signal of the coder-decoder 2 is transmitted to the receiver 3 through the fourth transistor Q4 and the fifth transistor Q5. This reduces fluctuation in the analog signal caused by change in continuity impedance of the transistors, thereby improving sound quality.

Optionally, as shown in FIG. 3, the receiver control circuit further includes a sixth resistor R6 and a seventh resistor R7, where the sixth resistor R6 is connected in series between the source electrode S4 of the fourth transistor Q4 and a ground terminal, and the seventh resistor R7 is connected in series between the source electrode S5 of the fifth transistor Q5 and the ground terminal.

Specifically, when the smart power amplifier module 1 drives the receiver 3, continuity between the first transistor Q1 and the second transistor Q2 is established, the fourth transistor Q4 and the fifth transistor Q5 are cut off, the smart power amplifier module 1 outputs a PWM signal, and the PWM signal may be induced to a side of the coder-decoder 2 by the fourth transistor Q4 and the fifth transistor Q5. In this embodiment of this application, the sixth resistor R6 and the seventh resistor R7 that are grounded can filter the signal on the side of the coder-decoder 2, to which the PWM signal is induced by the fourth transistor Q4 and the fifth transistor Q5.

Optionally, as shown in FIG. 3, the receiver control circuit further includes a fifth capacitor C5, where the fifth capacitor C5 is connected in series between the gate electrode G1 of the first transistor Q1 and the first input terminal IP of the receiver 3; and a sixth capacitor C6, where the sixth capacitor C6 is connected in series between the gate electrode G2 of the second transistor Q2 and the second input terminal IN of the receiver 3.

Specifically, when the coder-decoder 2 drives the receiver 3, because the coder-decoder 2 outputs a negative voltage, even if the voltage of the gate electrode G1 of the first transistor Q1 and the voltage of the gate electrode G2 of the second transistor Q2 are pulled down by the third transistor Q3, continuity between the first transistor Q1 and the second transistor Q2 may be consequently established. Therefore, in this embodiment of this application, the fifth capacitor C5 and the sixth capacitor C6 may further pull down the voltage of the gate electrode G1 of the first transistor Q1 and the voltage of the gate electrode G2 of the second transistor Q2, so as to ensure cutoff between the first transistor Q1 and the second transistor Q2.

Figure 4:
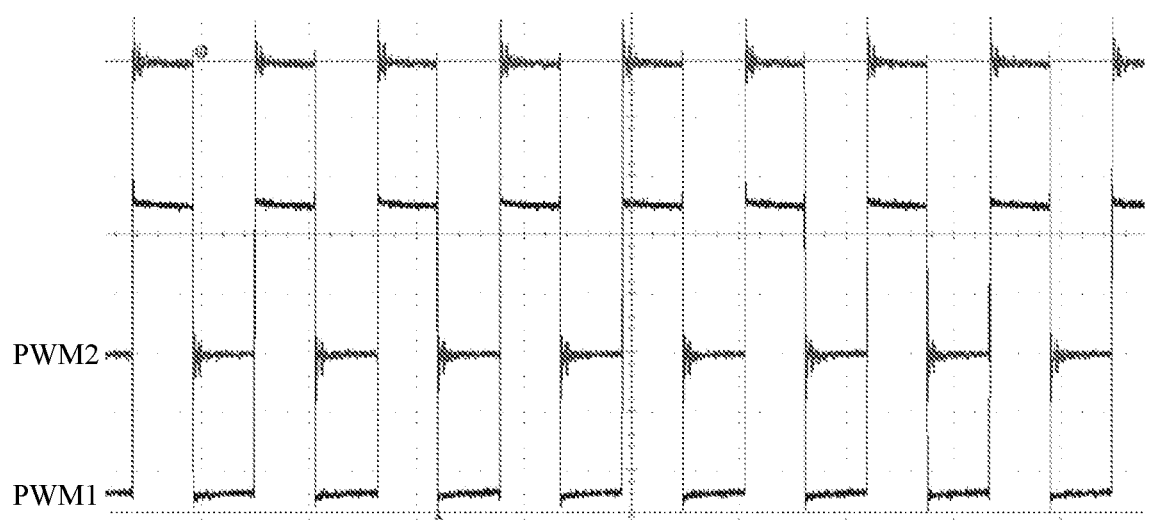
FIG. 4 is a schematic simulation diagram of a drain electrode voltage and a gate electrode voltage that are of a first transistor shown in FIG. 3.

The following describes a working process of the receiver control circuit with a structure shown in FIG. 3. For example, values of resistance of the first resistor R1, the second resistor R2, the third resistor R3, the sixth resistor R6, and the seventh resistor R7 are all 4.7 kΩ, values of resistance of the fourth resistor R4 and the fifth resistor R5 are 37.4 kΩ, values of capacitance of the first capacitor C1, the second capacitor C2, the fifth capacitor C5, and the sixth capacitor C6 are all 100 nF, and values of capacitance of the fourth capacitor C4 and the fifth capacitor C5 are both 4.7 nF. During implementation of a stereo function, continuity between the first transistor Q1 and the second transistor Q2 is controlled, the third transistor Q3, the fourth transistor Q4, and the fifth transistor Q5 are cut off, and the smart power amplifier module 1 outputs the PWM signal to the receiver 3 to drive the receiver 3. For example, as shown in FIG. 4, FIG. 4 is a schematic simulation diagram of a drain electrode voltage and a gate electrode voltage that are of the first transistor shown in FIG. 3. The PWM signal output by the first output terminal P1 of the smart power amplifier module 1 is PWM1 in FIG. 4, PWM1 is a pulse with a high voltage of 10 V and a low voltage of 0) V, and the DC bias voltage terminal VBST outputs a DC voltage of 10 V. Due to the functions of the first capacitor C1, the first resistor R1, and the third resistor R3, a voltage of the gate electrode G1 of the first transistor Q1 is 1.5 times a voltage of the source electrode SI thereof. A voltage of the gate electrode G1 of the first transistor Q1 is PWM2 in FIG. 4, and PWM2 is also a pulse with a voltage obtained by adding 5 V to the PWM1, that is, a signal of 5 V to 10 V. This ensures that a voltage difference between the gate electrode G1 of the first transistor Q1 and the source electrode SI thereof is 5 V, that is, continuity of the first transistor Q1. The continuity of second transistor Q2 may be established based on a same principle. When functions of a proximity sensor are implemented, continuity of the third transistor Q3 is controlled to pull down the gate electrode voltages of the first transistor Q1 and the second transistor Q2, the first transistor Q1 and the second transistor Q2 are cut off, and continuity between the fourth transistor Q4 and the fifth transistor Q5 is controlled by the first DC bias control terminal V1 and the second DC bias control terminal V2. In this case, the first DC bias control terminal V1 and the second DC bias control terminal V2 both provide DC bias voltages, the first output terminal P2 and the second output terminal N2 of the coder-decoder 2 output analog signals. Moreover, the second follower unit 62 keeps an unchanged voltage difference, between the gate electrode G4 of the fourth transistor Q4 and the source electrode S4 thereof, that is, unchanged continuity impedance of the fourth transistor Q4. This reduces distortion of the analog signals. The analog signals are transmitted to the receiver 3 by the fourth transistor Q4 and the fifth transistor Q5. In other words, the receiver 3 is driven by the coder-decoder 2, allowing the receiver 3 to emit ultrasonic waves, thereby implementing the functions of the proximity sensor.

An embodiment of this application further provides a terminal, including the foregoing receiver control circuit. A specific structure and principle of the receiver control circuit is the same as the foregoing embodiments. Details are not described herein again. The receiver 3 is configured to convert an audio electrical signal into a sound signal. When the terminal receives a call or a voice message, the voice may be heard by putting the receiver 3 close to the human ear. The terminal in this embodiment of this application may be an electronic device such as a mobile phone.

In the embodiments of this application, "at least one" means one or more, and "a plurality of" means two or more. "And/or" is an association relationship used for describing associated objects, representing that three relationships may exist. For example, A and/or B may represent the following three cases: only A, both A and B, and only B, where A and B may be singular or plural. The character "/" generally indicates an "or" relationship between the associated objects before and after the character. In this application, "at least one of the following items" and similar expressions mean any combination of these items, including one of the items or any combination of a plurality of items. For example, at least one of a, b, and c may represent: a, b, c, a and b, a and c, b and c, or a and b and c, where a, b, and c may be singular or plural.

The foregoing embodiments are merely preferred embodiments, and are not intended to limit this application. A person skilled in the art may modify or change this application. Any modification, equivalent replacement, improvement or the like made within the spirit and principle of this disclosure shall fall within the protection scope of this disclosure.

What is claimed is:
1. A receiver control circuit, comprising:
a smart power amplifier;
a coder-decoder;
a receiver;
a first switch; and
a second switch,
wherein the smart power amplifier is electrically connected to the receiver by the first switch;
wherein the first switch comprises a first switch component;
wherein the first switch component is connected between the smart power amplifier and the receiver, the first switch component is configured to control continuity and cutoff between the smart power amplifier and the receiver, and the first switch component is formed by a first metal oxide semiconductor field-effect transistor (MOSFET);
wherein the first MOSFET of the first switch component is of N-type, a drain electrode of the first MOSFET is electrically connected to the smart power amplifier, and a source electrode of the first MOSFET is electrically connected to the receiver;
wherein the first switch further comprises a first follower circuit, wherein the first follower circuit is configured to keep an unchanged voltage difference between a gate electrode of the first MOSFET and the drain electrode of the first MOSFET, and wherein a gate electrode voltage of the first MOSFET is greater than a drain electrode voltage of the first MOSFET;
wherein the coder-decoder is electrically connected to the receiver by the second switch; and wherein the second switch comprises a second switch component, wherein the second switch component is connected between the coder-decoder and the receiver, the second switch component is configured to control continuity and cutoff between the coder-decoder and the receiver, and the second switch component is formed by a second MOSFET, a source electrode of the second MOSFET of the second switch component is electrically connected to the coder-decoder, and a drain electrode of the second MOSFET is electrically connected to the receiver.

2. The receiver control circuit according to claim 1, wherein the second MOSFET is of N-type; and
wherein the second switch further comprises a second follower circuit, wherein the second follower circuit is configured to keep an unchanged voltage difference between a gate electrode of the second MOSFET and the source electrode of the second MOSFET.

3. The receiver control circuit according to claim 1, wherein the smart power amplifier comprises a first output terminal and a second output terminal;
wherein the receiver comprises a first input terminal and a second input terminal;
wherein the first switch component comprises a first transistor and a second transistor, wherein the first transistor and the second transistor are N-type MOSFETs, a source electrode of the first transistor is electrically connected to the first input terminal of the receiver, a drain electrode of the first transistor is electrically connected to the first output terminal of the smart power amplifier, a source electrode of the second transistor is electrically connected to the second input terminal of the receiver, and a drain electrode of the second transistor is electrically connected to the second output terminal of the smart power amplifier; and
wherein the first follower circuit comprises:
a first capacitor, wherein the first capacitor is connected in series between a gate electrode of the first transistor and the drain electrode of the first transistor;
a second capacitor, wherein the second capacitor is connected in series between a gate electrode of the second transistor and the drain electrode of the second transistor;
a first resistor, wherein the first resistor is connected in series between the gate electrode of the first transistor and a direct current (DC) bias control point; and
a second resistor, wherein the second resistor is connected in series between the gate electrode of the second transistor and the DC bias control point.

4. The receiver control circuit according to claim 3, further comprising:
a third resistor, wherein the third resistor is connected in series between the DC bias control point and a DC bias voltage terminal; and
a third transistor, wherein the third transistor is connected in series between the DC bias control point and a ground terminal.

5. The receiver control circuit according to claim 2, wherein the coder-decoder comprises a first output terminal and a second output terminal;
wherein the receiver comprises a first input terminal and a second input terminal;
wherein the second switch component comprises a fourth transistor and a fifth transistor, wherein the fourth transistor and the fifth transistor are N-type MOSFETs, a source electrode of the fourth transistor is electrically connected to the first output terminal of the coder-decoder, a drain electrode of the fourth transistor is electrically connected to the first input terminal of the receiver, a source electrode of the fifth transistor is electrically connected to the second output terminal of the coder-decoder, and a drain electrode of the fifth transistor is electrically connected to the second input terminal of the receiver; and
wherein the second follower circuit comprises:
a third capacitor, wherein the third capacitor is connected in series between the source electrode of the fourth transistor and a gate electrode of the fourth transistor;
a fourth resistor, wherein the fourth resistor is connected in series between the gate electrode of the fourth transistor and a first DC bias control terminal;
a fourth capacitor, wherein the fourth capacitor is connected in series between the source electrode of the fifth transistor and a gate electrode of the fifth transistor; and
a fifth resistor, wherein the fifth resistor is connected in series between the gate electrode of the fifth transistor and a second DC bias control terminal.

6. The receiver control circuit according to claim 5, further comprising:
a sixth resistor and a seventh resistor, wherein the sixth resistor is connected in series between the source electrode of the fourth transistor and a ground terminal, and the seventh resistor is connected in series between the source electrode of the fifth transistor and the ground terminal.

7. The receiver control circuit according to claim 3, further comprising:
a fifth capacitor, wherein the fifth capacitor is connected in series between the gate electrode of the first transistor and the first input terminal of the receiver; and
a sixth capacitor, wherein the sixth capacitor is connected in series between the gate electrode of the second transistor and the second input terminal of the receiver.

8. A terminal comprising a receiver control circuit, wherein the receiver control circuit includes:
a smart power amplifier;
a coder-decoder;
a receiver;
a first switch; and
a second switch,
wherein the smart power amplifier is electrically connected to the receiver by the first switch;
wherein the first switch comprises a first switch component;
wherein the first switch component is connected between the smart power amplifier and the receiver, the first switch component is configured to control continuity and cutoff between the smart power amplifier and the receiver, and the first switch component is formed by a first metal oxide semiconductor field-effect transistor (MOSFET);
wherein the first MOSFET of the first switch component is of N-type, a drain electrode of the first MOSFET is electrically connected to the smart power amplifier, and a source electrode of the first MOSFET is electrically connected to the receiver;
wherein the first switch further comprises a first follower circuit, wherein the first follower circuit is configured to keep an unchanged voltage difference between a gate electrode of the first MOSFET and the drain electrode of the first MOSFET, and wherein a gate electrode voltage of the first MOSFET is greater than a drain electrode voltage of the first MOSFET;

wherein the coder-decoder is electrically connected to the receiver by the second switch; and wherein the second switch comprises a second switch component, wherein the second switch component is connected between the coder-decoder and the receiver, the second switch component is configured to control continuity and cutoff between the coder-decoder and the receiver, and the second switch component is formed by a second MOSFET, a source electrode of the second MOSFET of the second switch component is electrically connected to the coder-decoder, and a drain electrode of the second MOSFET is electrically connected to the receiver.

\* \* \* \* \*